United States Patent [19]
Talaga, Jr.

[11] Patent Number: 5,926,042
[45] Date of Patent: Jul. 20, 1999

[54] PRECISION CLOCK FREQUENCY DETECTOR HAVING REDUCED SUPPLY VOLTAGE DEPENDENCE

[75] Inventor: Ronald F. Talaga, Jr., Austin, Tex.

[73] Assignee: Advanced Micro Devices, Inc., Sunnyvale, Calif.

[21] Appl. No.: 08/994,137

[22] Filed: Dec. 19, 1997

[51] Int. Cl.⁶ .............................. G01R 23/02; H03D 3/00; H03K 9/06
[52] U.S. Cl. .............................. 327/45; 327/47; 327/102; 327/132
[58] Field of Search .................................. 327/44, 45, 47, 327/49, 102, 143, 198, 182, 183, 356, 132

[56] References Cited

U.S. PATENT DOCUMENTS

| | | | |
|---|---|---|---|
| 3,575,611 | 4/1971 | Reed | 327/102 |
| 3,593,171 | 7/1971 | Gassmann | 329/314 |
| 3,626,204 | 12/1971 | Brandon | 327/102 |
| 4,009,398 | 2/1977 | Yamada et al. | 327/132 |
| 4,471,326 | 9/1984 | Steckler et al. | 331/111 |
| 4,598,259 | 7/1986 | Gontowski, Jr. | 331/111 |
| 4,633,097 | 12/1986 | Dewitt | 327/102 |
| 4,686,432 | 8/1987 | Berland et al. | 327/132 |
| 5,592,111 | 1/1997 | Wong et al. | 327/45 |

*Primary Examiner*—Timothy P. Callahan
*Assistant Examiner*—An T. Luu
*Attorney, Agent, or Firm*—Conley, Rose & Tayon, PC; B. Noel Kivlin

[57] ABSTRACT

A clock frequency detector is provided having a precise trip frequency which is insensitive to power supply variations. In one embodiment, the clock frequency detector employs a current source to discharge a capacitor at a constant rate and a gated current source to charge the capacitor at a frequency-dependent rate. If the charge rate exceeds the discharge rate, the capacitor will charge and an output signal is asserted. The gated current source is controlled by an edge-triggered pulse generator which generates pulses of a precise width in response to edges in the input clock signal. To create these pulses, the pulse generator produces an inverted clock signal with delayed transitions and combined this signal with the clock signal. The delayed transitions are created using a capacitor which is charged by a current source. The capacitor is provided with a shunt transistor which drains the charge from the capacitor whenever the clock signal is asserted. When the clock signal is de-asserted, the capacitor is allowed to charge, and an op-amp detects when the capacitor voltage exceeds a reference voltage and asserts an output signal. The reference voltage is also provided using a current source, so the transition delay is independent of changes in the power supply voltage. The clock frequency detector provided herein has a high precision with respect to process variation. A consistent frequency detection performance is achieved which is insensitive to changes in power supply voltage. This advantageously provides microprocessors with an added degree of reliability as higher circuit densities and lower supply voltages are pursued.

13 Claims, 4 Drawing Sheets

5,926,042

PRECISION CLOCK FREQUENCY DETECTOR HAVING REDUCED SUPPLY VOLTAGE DEPENDENCE

BACKGROUND OF THE INVENTION

1. Field of the Invention

This invention relates to the field of frequency detection circuits, and in particular to a clock frequency detector which is insensitive to power supply variations.

2. Description of the Related Art

Microprocessor frequencies are getting higher every year even as power supply voltages are being decreased to allow increased device densities and decreased power consumption. Clock circuit designs must be constantly improved to keep up. As a microprocessor proceeds through its power-up sequence, one of the very first steps is to obtain a clock signal within the specified operating parameters. A microprocessor will typically include a clock frequency detector to determine when the clock signal is within the range required for proper microprocessor operation. It is desirable for the clock frequency detector to have precise trip frequencies over a range of process variations to ensure that the provided clock frequency is within the specified range. It is also desirable that the operation of the clock frequency detector be insensitive to variations in the power supply voltage since various power supply voltages are being employed with any given microprocessor architecture to provide multiple performance vs. portability trade-off points.

SUMMARY OF THE INVENTION

The problems outlined above are in large part solved by a clock frequency detector having a precise trip frequency which is insensitive to power supply variations. In one embodiment, the clock frequency detector employs a current source to discharge a capacitor at a constant rate and a gated current source to charge the capacitor at a frequency-dependent rate. If the charge rate exceeds the discharge rate, the capacitor will charge and an output signal is asserted. The gated current source is controlled by an edge-triggered pulse generator which generates pulses of a precise width in response to edges in the input clock signal. To create these pulses, the pulse generator produces an inverted clock signal with delayed transitions and combined this signal with the clock signal. The delayed transitions are created using a capacitor which is charged by a current source. The capacitor is provided with a shunt transistor which drains the charge from the capacitor whenever the clock signal is asserted. When the clock signal is de-asserted, the capacitor is allowed to charge, and a differential amplifier detects when the capacitor voltage exceeds a reference voltage and asserts an output signal. The reference voltage is also provided using a current source, so the transition delay is independent of changes in the power supply voltage.

The clock frequency detector provided herein has a high precision with respect to process variation. A consistent frequency detection performance is achieved which is insensitive to changes in power supply voltage. This advantageously provides microprocessors with an added degree of reliability as higher circuit densities and lower supply voltages are pursued.

Broadly speaking, the present invention contemplates a clock frequency detector which comprises: a capacitor, a discharging current mirror, a charging current mirror, a gating transistor, and a precise width pulse generator. The discharging current mirror is coupled to the capacitor to continuously discharge the capacitor at a constant rate. The charging current mirror is coupled to the capacitor to provide a charging current to the capacitor. The gating transistor is coupled to the charging current mirror to gate the charging current in response to a pulse signal, and the precise width pulse generator is configured to receive a clock signal and is coupled to provide the pulse signal to the gating transistor. The precise width pulse generator provides pulses of a predetermined width in the pulse signal in response to edges in the clock signal.

BRIEF DESCRIPTION OF THE DRAWINGS

Other objects and advantages of the invention will become apparent upon reading the following detailed description and upon reference to the accompanying drawings in which.

Figure 1:
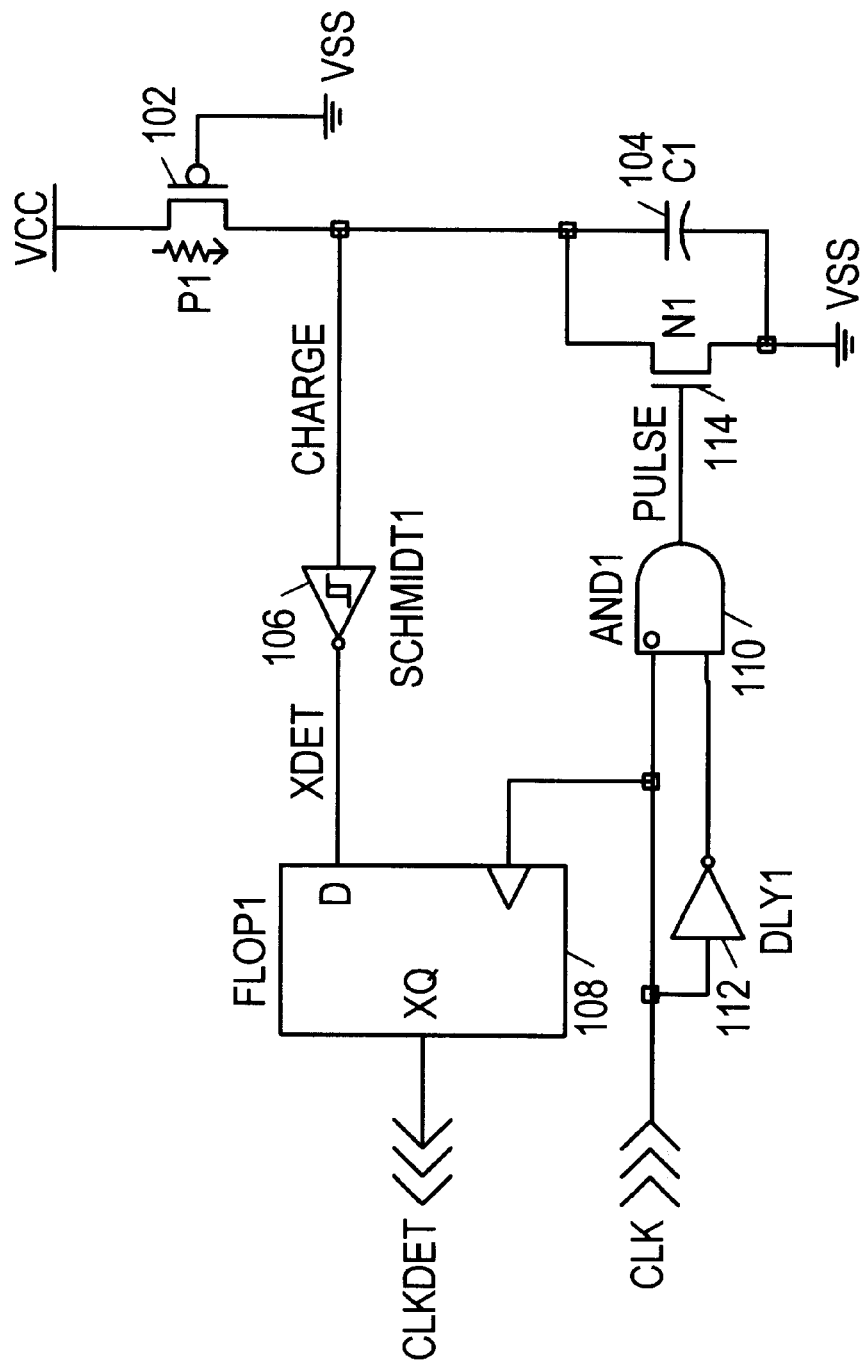
FIG. 1 shows a first embodiment of a clock detection circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the figures, FIG. 1 shows a first embodiment of a clock detector. At power-up, a resistive transistor 102 begins to charge a capacitor 104. The charge on capacitor 104 trips inverter 106, and D-flip flop 108 latches the low output of inverter 106. The output of flip flop 108 is the clock frequency detected signal, which indicates when the frequency of the input clock signal is high enough for device operation. The input clock signal is received by a logical AND gate 110 and a time-delay inverter 112. Inverter 112 is provided with a predetermined propagation delay. Logic gate 110 performs a logical AND of the clock signal and the time-delayed inverted clock signal provided by inverter 112. The resulting output of logic gate 110 is a positive-clock-edge triggered pulse having a duration equal to the propagation delay of the inverter 112. These pulses are applied to a transistor 114 which is coupled across the capacitor 104 to drain some of the charge with each pulse. When the average discharge rate exceeds the charging rate of the capacitor, capacitor 104 discharges and triggers inverter 106 high. Subsequently, flip flop 106 latches this high state, and the clock detect signal is asserted.

In this embodiment, the propagation delay through the inverter is a strong function of the supply voltage. At the high supply voltages, the propagation delay is reduced to a small fraction of the low-voltage propagation delay. As a result, the capacitor discharge pulses each remove a much smaller amount of charge and the required input frequency to discharge the capacitor becomes much higher. Compounding the problem is the current variation through resistive transistor 102, which causes a higher charging current to be present for the higher supply voltages. The lack of precision makes this embodiment difficult to use.

Figure 2:
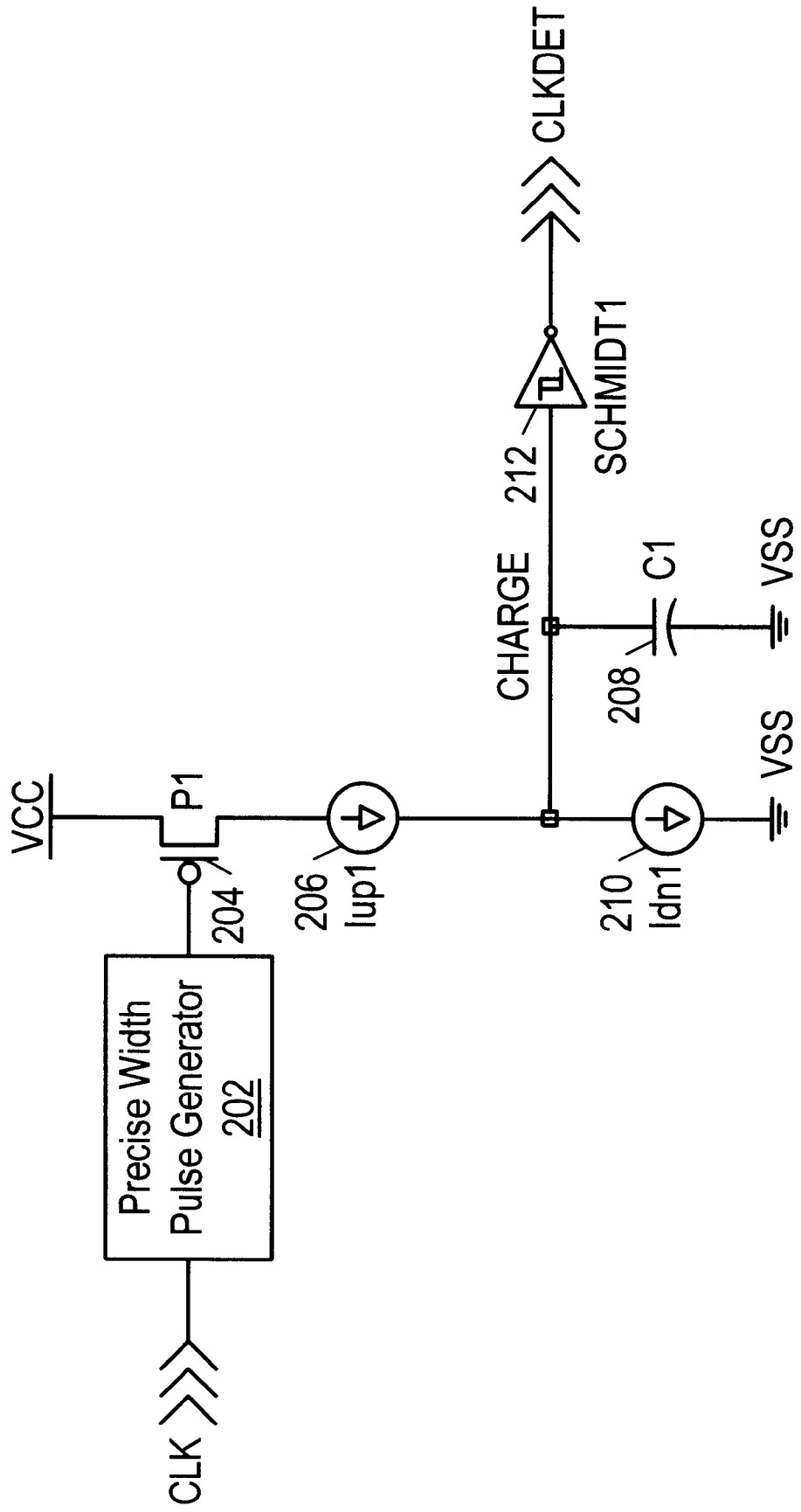
FIG. 2 shows a second embodiment of a clock detection circuit.

FIG. 2 shows a second embodiment of a clock frequency detector. In this embodiment, a precise width pulse generator 202 receives a clock signal and provides pulses of a precise predetermined width in response to edges in the clock signal. These pulses are applied to a transistor 204 coupled to provide power to a current mirror 206. During pulses, current mirror 206 provides charge at a constant rate onto a capacitor 208. A second current mirror 210 continuously removes charge from capacitor 208 at a constant rate. When the incoming clock frequency is above the trip frequency, charge is added to capacitor 208 at a faster rate than it is removed, and capacitor 208 charges, thereby causing an inverter 212 to assert a clock detect signal. Using current mirrors or other robust current sources reduces the supply voltage dependency, as does using the precise width pulse generator.

The trip frequency may be determined by setting the average charging current equal to the discharging current. The average charging current is the clock frequency times the charge added to the capacitor by each pulse:

$$I_{AVE} = Q_{PULSE} F_{CLOCK} = (I_{CH} T_{PULSE}) F_{CLOCK}$$

When this is set equal to the discharging current, the trip frequency is found to be:

$$F_{TRIP} = I_{DISCH}/(I_{CH} T_{PULSE})$$

For a pulse width of (say) 5 nanoseconds, setting the charge/discharge current ratio at 20:1 will provide a trip frequency of 10 MHz. A ratio of 4:1 would provide a trip frequency of 50 MHz.

Figure 3:
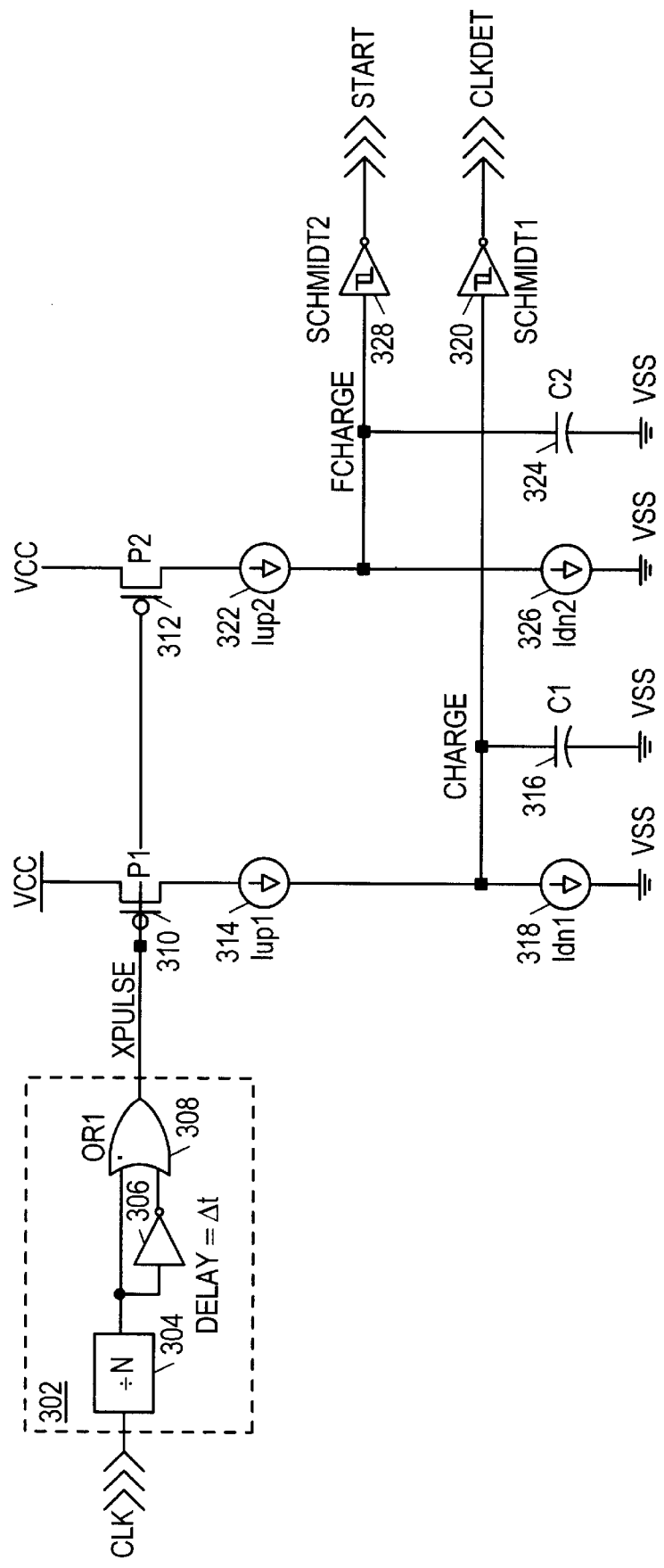
FIG. 3 shows a third embodiment of a clock detection circuit.

FIG. 3 shows a third embodiment of a clock frequency detector in which a precise width pulse generator 302 is implemented with a divide by N counter 304, a time delay inverter 306, and a logical OR gate 308. The output of pulse generator 302 is provided to two transistors 310 and 312. Transistor 310 powers current mirror 314, which operates to charge a capacitor 316 when the pulses are asserted. As in the previous embodiment, capacitor 316 is being continuously discharged at a constant rate by a current mirror 318. The charging of capacitor 316 occurs if the clock frequency exceeds a trip rate, and a inverter 320 asserts a clock frequency detect signal when capacitor 316 charges. Transistor 312 powers a current mirror 322, which operates to charge a capacitor 324 when the pulses are asserted. Capacitor 324 is being continuously discharged a constant rate by a current mirror 326. The charging of capacitor 324 occurs if the clock frequency exceeds a second trip rate, and an inverter 328 asserts a second clock frequency detect signal when capacitor 324 charges.

In one embodiment, the current ratios of current mirror pairs 314, 318, and 322, 326 are the same, and capacitor 324 is chosen to be larger than capacitor 316. This allows both capacitors to charge for the same trip frequency, but provides that the assertion of one detection signal will be delayed relative to the other. This may provide for an advantageous timing mechanism. In an alternate embodiment, the current ratios of the current mirror pairs are different, thereby providing different trip frequencies for each of the capacitors. In this embodiment, the clock frequency may be determined to be within a range of frequencies between the first trip frequency and the second trip frequency when only one of the clock frequency detect signals is asserted.

One implementation of the precise width pulse generator 302 is shown. Counter 304 divides down the incoming frequency and can provide a reduced frequency signal having a 50% duty cycle. The reduced frequency signal is provided to inverter 306 and logic gate 308. The reduced frequency signal experiences a time delay when propagating through inverter 306. Logic gate 308 asserts a pulse signal when both its inputs are low, which occurs briefly for negative transitions in the reduced frequency signal.

Figure 4:
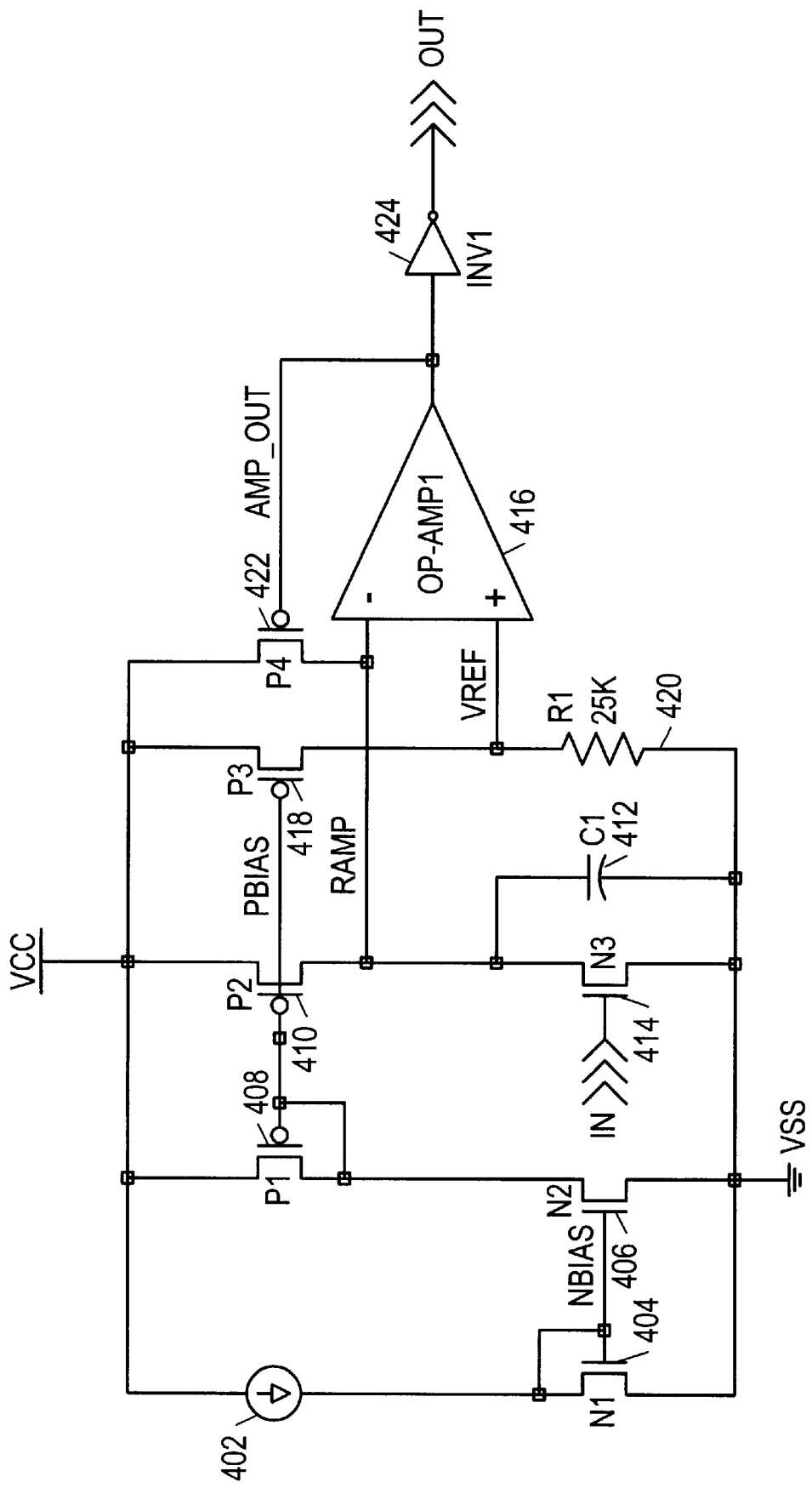
FIG. 4 shows one embodiment of a delay element.

The propagation delay of inverter 306 should be insensitive to variations in the supply voltage. One embodiment of inverter 306 is shown in FIG. 4. A current source 402 provides a reference current to a current mirror formed by transistors 404 and 406. This current mirror may be configured to multiply the reference current, so that the current drawn by transistor 406 is larger than the reference current. Transistor 406 draws current through transistor 408. A charging transistor 410 is set up to mirror the current through transistor 408, again possibly using a multiplicative factor. Charging transistor 410 continuously provides a charging current to a capacitor 412. A shunt transistor 414 discharges capacitor 412 when the input signal is asserted. When the input signal is de-asserted, shunt transistor 414 stops conducting, and capacitor 412 charges at a constant rate.

A reference transistor 418 is also set up to mirror the current through transistor 408, possibly using a multiplicative factor. The current through reference transistor 418 is provided to a resistor 420 to create a reference voltage. A differential amplifier 416 compares the voltage on capacitor 412 to the reference voltage, switching when the voltage on the capacitor exceeds the reference voltage. A hysteresis transistor 422 receives the output from the differential amplifier 416 pulls the capacitor voltage high when the output is asserted. An output inverter 424 provides as output the inverted output of differential amplifier 416. Due to the usage of current sources and current mirrors, the supply voltage dependence is largely eliminated, and the width of the generated pulses does not change.

An analysis of the embodiments of FIGS. 2, 3, and 4 to determine process variability has been done. Allowing for resistance variations of +/−20% and capacitance variations of +/−15%, the variability of the clock frequency trip points is approximately 2, i.e. trip frequency lies within a range having a maximum frequency which is twice the minimum frequency of the range.

Alternate embodiments of the time-delay inverter may use fewer current mirrors, since current multiplication may be unnecessary. Further, the time-delay inverter may be configured to generate precise delays for positive edges as well as negative edges. Also, the inversion function provided by output inverter 424 may be subsumed into the differential amplifier 416 by reversing the inputs.

Numerous variations and modifications will become apparent to those skilled in the art once the above disclosure is fully appreciated. It is intended that the following claims be interpreted to embrace all such variations and modifications.

What is claimed is:

1. A clock frequency detector which comprises:
   a capacitor;
   a discharging current mirror coupled to the capacitor and configured to continuously discharge the capacitor at a constant rate;
   a charging current mirror coupled to the capacitor and configured to provide a charging current to the capacitor;
   a gating transistor coupled to the charging current mirror and configured to gate the charging current in response to a pulse signal; and a precise width pulse generator configured to receive a clock signal and configured to provide the pulse signal to the gating transistor, wherein the precise width pulse generator provides pulses of a predetermined width in the pulse signal in response to edges in the clock signal.

2. The clock frequency detector of claim 1, further comprising a Schmidt inverter coupled to the capacitor and configured to assert a clock detect signal only if the capacitor achieves a predetermined voltage.

3. The clock frequency detector of claim 1, wherein the precise width pulse generator comprises:
   a second capacitor;
   a second charging current mirror coupled to the second capacitor and configured to continuously charge the second capacitor at a constant rate; and
   a shunt transistor configured to receive the clock signal and coupled to the second capacitor to discharge the second capacitor when the clock signal is asserted.

4. The clock frequency detector of claim 3, wherein the precise width pulse generator further comprises a differential amplifier configured to provide a delayed transition signal, wherein the differential amplifier has a first input coupled to a reference voltage and a second input coupled to detect a voltage on the second capacitor.

5. The clock frequency detector of claim 4, wherein the precise width pulse generator further comprises a logic gate coupled to receive the clock signal and the delayed transition signal, wherein the logic gate is coupled to provide the pulse signal to the gating transistor.

6. The clock frequency detector of claim 5, wherein the logic gate is an OR gate.

7. The clock frequency detector of claim 1, further comprising:
   a second capacitor;
   a second discharging current mirror coupled to the second capacitor and configured to continuously discharge the second capacitor at a constant rate;
   a second charging current mirror coupled to the second capacitor and configured to provide a second charging current to the second capacitor;
   a second gating transistor coupled to the second charging current mirror and configured to gate the second charging current in response to the pulse signal from the precise width pulse generator.

8. The clock frequency detector of claim 7, wherein the charging current mirror and the discharging current mirror have a first current ratio, wherein the second charging current mirror and the second discharging current mirror have a second current ratio, wherein the first current ratio equals the second current ratio, and wherein the capacitor and the second capacitor have different capacitances.

9. The clock frequency detector of claim 7, further comprising a second Schmidt inverter coupled to the second capacitor and configured to assert a second clock detect signal only if the second capacitor achieves a predetermined voltage.

10. The clock frequency detector of claim 9, wherein the charging current mirror and the discharging current mirror have a first current ratio, wherein the second charging current mirror and the second discharging current mirror have a second current ratio, wherein the first current ratio is different from the second current ratio, and wherein the first clock detect signal is indicative of when frequency of the clock signal is larger than a minimum clock frequency and the second clock detect signal is indicative of when the frequency of the clock signal is larger than a maximum clock frequency.

11. A method for determining when a clock signal frequency exceeds a predetermined frequency value, wherein the method comprises:
   receiving a clock signal having transitions;
   generating precise-width pulses in response to the transitions;
   gating a fixed-value charging current for a capacitor in response to the precise-width pulses;
   continuously drawing a fixed-maximum-value discharging current from the capacitor;
   asserting an output signal when the capacitor achieves a voltage greater than a predetermined value.

12. The method of claim 11, wherein the generating step comprises providing the clock signal and a delayed-transition inverted clock signal to a logic gate which asserts a pulse signal only when both the clock signal and the delayed-transition inverted clock signal are the same.

13. The method of claim 12, wherein providing the delayed-transition inverted clock signal comprises:
   continuously providing a fixed charging current to a second capacitor;
   discharging the second capacitor when the clock signal is asserted;
   comparing a voltage of the second capacitor to a reference voltage; and
   asserting the delayed-transition inverted clock signal when the voltage of the second capacitor exceeds the reference voltage.

* * * * *